United States Patent [19]

Crowle

[11] 4,058,775
[45] Nov. 15, 1977

[54] OVER-CURRENT PREVENTION CIRCUITRY FOR TRANSISTOR AMPLIFIERS

[75] Inventor: Brian Crowle, Ashford, England

[73] Assignee: RCA Corporation, New York, N.Y.

[21] Appl. No.: 658,724

[22] Filed: Feb. 17, 1976

[30] Foreign Application Priority Data

Jan. 27, 1976 United Kingdom .................. 7657/75

[51] Int. Cl.$^2$ .............................................. H03F 3/30
[52] U.S. Cl. .................................... 330/267; 330/298; 330/207 P; 330/275
[58] Field of Search ................... 330/13, 15, 22, 30 D, 330/28, 38 M, 207 P, 14; 307/202 R; 317/33 R

[56] References Cited

U.S. PATENT DOCUMENTS

| | | | |
|---|---|---|---|
| 3,517,270 | 6/1970 | Dilley | 330/30 D X |
| 3,538,449 | 11/1970 | Solomon | 330/30 D |
| 3,678,291 | 7/1972 | Coe | 330/207 P X |
| 3,697,882 | 10/1972 | Van Der Plassche | 330/15 |
| 3,769,605 | 10/1973 | Long | 330/30 D |
| 3,855,540 | 12/1974 | Leidich | 330/14 |

Primary Examiner—James B. Mullins
Attorney, Agent, or Firm—H. Christoffersen; S. Cohen; A. L. Limberg

[57] ABSTRACT

The maximum drive currents available to the output transistors of a Class B or AB push-pull amplifier are controlled as a function of their emitter-to-collector voltages, permitting the operation of the transistors over substantially their entire safe operating area ratings.

21 Claims, 3 Drawing Figures

OVER-CURRENT PREVENTION CIRCUITRY FOR TRANSISTOR AMPLIFIERS

The present invention concerns protection circuitry for preventing overly large current in the output transistors of an amplifier, in which the output transistors are arranged for Class B or AB operation, thereby to avoid thermal over-dissipation and secondary breakdown of the output transistors.

Burwen and Sondermeyer describe in U.S. Pat. Nos. 3,500,218 and 3,536,958, respectively, the limiting of the permissible base current drives to each of the output transistors between upper and lower values in linear relationship to the decrease and increase of its emitter-to-collector potential between saturation and quiescent value, the lower value of limiting being maintained as the transistor emitter-to-collector potential increases beyond its quiescent value. This is done to prevent operation of the output transistors outside their Safe Operating Area Rating (SOAR). The SOAR is the region of the transistor collector characteristic over which it can be operated without risk of damage or distraction due to over-dissipation or secondary breakdown.

The Burwen and Sondermeyer circuits are circuits in which, like earlier circuits, the output transistor to be protected is provided with an emitter resistor for sensing the magnitude of its emitter current flow, and a clamping transistor, the emitter-to-collector path of which is connected across the base-to-emitter path of the output transistor. The voltage developed across the resistor biases the clamping transistor into conduction when the output transistor attempts to draw excessive emitter current. This diverts base current flow from the output transistor.

An undesirable feature of these over-current prevention circuits using collector- or emitter-current sensing resistors in series with the collector-to-emitter paths of the output transistors is the following. The potential drops which must appear across the sensing resistors at higher current levels in order to activate the clamping transistors restricts the output signal swing across the load in some degree, reducing available output power. This reduction in output power delivering capability is particularly significant if the direct operating potential available to the amplifier is restricted. Also, the lost power must be dissipated from the amplifier circuitry, which is undesirable in integrated constructions since it tends towards raising the operating temperature of the amplifier.

Each of the over-current prevention circuits described above includes a non-linear current feedback circuit for diverting base current from the output transistor when the latter attempts to operate outside its SOAR.

Another approach which can be taken is to limit the maximum base current available to the output transistor at any time without recourse to current feedback and then to modulate the flow of this current to the output transistor as a function of input signal. This alternative approach avoids the problems associated with current-sensing resistors. A similar approach is described by Leidich in U.S. Pat. No. 3,855,540, where there is a fixed constraint upon the combined base currents available to a pair of Class AB amplifier output transistors driven in push-pull. The prior art approaches that restrict the availability of drive currents to the output transistors, but are unresponsive to the signal levels in the output transistors, do not permit Class B operation or Class AB operation approaching Class B operation, particularly at power levels of more than a few hundred milliwatts.

The present inventor has found that Class B operation or Class AB close to Class B operation can be achieved despite restriction of base drive to the output transistors independent of their collector-to-emitter currents, by making these restrictions depend upon the collector-to-emitter potentials of the transistors. One can achieve operation of the output transistors over portions of their SOAR's comparable to the portions over which output transistors in the Sondermeyer and Burwen circuits operate while avoiding the need for current sensing resistors.

In the drawing.

each of FIGS. 1 and 3 is a schematic diagram of a Class B amplifier embodying the present invention and having output transistors afforded over-current protection as outlined in the previous paragraph.

Figure 1:
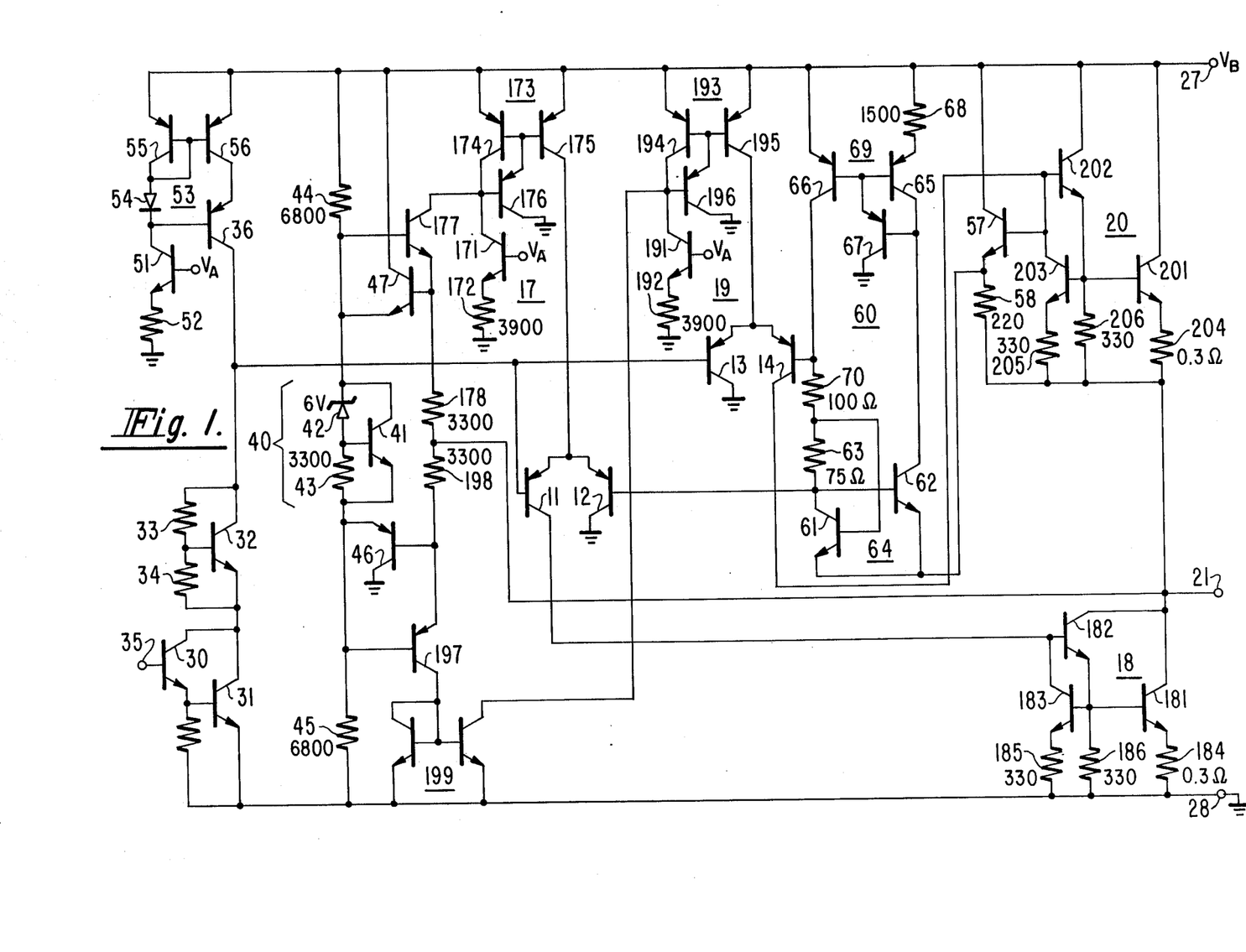

In FIG. 1, transistors 30 and 31 are in Darlington-like compound transistor structure, operated as a common-emitter amplifier to amplify low-level signal currents applied to terminal 35 and provided with a collector load comprising, in addition to a multiple-$V_{BE}$ potential offset regulator comprising elements 32–34, a constant current source at the collector electrode of 36. This constant current source and the relatively small combined quiescent base currents of transistors 11 and 13 supply the quiescent collector current demands transistors 30 and 31 present when an overall degenerative feedback connection around the amplifier (not shown), usually including a preamplifier stage, is completed from terminal 21 to terminal 35. The collector current variations of transistors 30 and 31 are coupled through elements 32–34 to be applied to the joined base electrodes of transistors 11 and 13.

Transistors 11 and 12 are connected in an emitter-coupled differential amplifier configuration, as are transistors 13 and 14. The joined emitter electrodes of 11 and 12 are supplied a bias current $I_{17}$ from a controlled current source 17, and the joined emitter electrodes of 13 and 14 are supplied a bias current $I_{19}$ from a controlled current source 19. Controlled current source 17 limits the collector current transistor 11 can deliver to one of the amplifier output transistors, a compound transistor structure 18. Controlled current source 19 limits the collector current transistor 14 can deliver to the other of the amplifier output transistors, a compound transistor structure 20. Compound transistor structures 18 and 20 are connected to terminal 21 for supplying an external load means, not shown, and the serial connection of their output circuits between operating potential terminals 27 and 28 causes them to provide active internal load means for each other absent connection to an external load means.

The base electrodes of transistors 12 and 14 are offset by a potential that is proportional to the $\Delta V_{BE}$ difference in the base-emitter potentials of two transistors operated at substantially the same temperature as transistors 11, 12, 13 and 14. Under quiescent conditions, the potential at the joined base electrodes of 11 and 13 is intermediate to the potentials at the base electrodes of 12 and 14 owing to the overall feedback connection around the amplifier attempting to adjust compound transistor structures 18 and 20 for substantially equal quiescent conduction. Thus, transistor 11 is biased to be substantially less conductive than 12, and transistor 14 is biased to be substantially less conductive than 13. Accordingly, transistors 11 and 14 supply small input currents to the similar compound transistor structures 18 and 20, respectively, to bias them to conduct an idling current that biases them for operating Class AB and thus avoids cross-over distortion.

A substantial positive signal current variation applied to the joined base electrodes of transistors 11 and 13 cuts off transistor 11 and reduces conduction of 13. The non-conduction of 11 interrupts the flow of input current to compound transistor structure 18, rendering it non-conductive. The reduced conduction of 13 permits increase in the portion of $I_{19}$ coupled by the common-base amplifier action of transistor 14 to compound transistor 20, in turn increasing its conduction. The non-conduction of compound transistor structure 18 and the increased conduction of compound transistor structure 20 causes the output signal at output terminal 21 to exhibit a more positive potential than during quiescent conditions.

On the other hand, a negative signal current variation applied to the joined base electrodes of transistors 11 and 13 increases conduction through each of them. The increased conduction of 11 causes an increase in the portion of $I_{17}$ supplied to compound transistor 18, increasing its conduction. The increased conduction of transistor 13 causes it to appropriate to itself all of $I_{19}$, rendering transistor 14 and consequently compound transistor structure 20 non-conductive. The result is that the output signal at output terminal 21 exhibits a less positive potential than during quiescent conditions.

Compound transistor 18 includes a large transistor 181, which in fact may be several smaller transistors operating in parallel. Transistor 181 is connected in cascade after 182 in a connection much like the conventional Darlington cascade. A third transistor 183 is connected to stabilize the current gain of the cascaded transistor 181 and 182 to predictable values despite their common-emitter forward current gains ($h_{fe}$'s) exhibiting the normal range of manufacturing tolerances.

Predictable low-level current gains are desired of compound transistors 18 and 20 so their idling current can be set to the lowest level consistent with low crossover distortion in their Class B push-pull operation, the ultimate aim being to reduce standby thermal dissipation from compound transistors 18 and 20.

At low idling current levels, the potential drops across the emitter degeneration resistors 184 and 185 of 181 and 183, respectively, will be negligibly small. The internal emitter resistances of 181 and 183 will be much larger than the resistances of resistors 184 and 185, respectively. Under these circumstances, resistors 184 and 185 have negligible effect upon operation of compound transistor 18. Compound transistor 18 behaves as a current mirror amplifier, its current gain being equal to the transconductance of 181 divided by the transconductance of 183. The transconductances of transistors with similar base-emitter junction doping profiles are related proportionally to the areas of their base-emitter junctions. Transistor 183 is usually made relatively small as compared to 181, so the transconductance of 183 is smaller than that of 181 by a factor. This factor is equal to the low-level current gain of compound transistor 18.

Predictable high-level current gains are desired of compound transistors 18 and 20 so they may be afforded a predictable degree of over-current protection by controlling the input current drive applied to their effective base electrodes.

At higher current levels, as are encountered during peaks of output signal, the internal emitter resistances of transistors 181 and 183 are no longer high compared to the resistances of resistors 184 and 185. The effective transconductances of transistors 181 and 183 will be reduced by current feedback across their degeneration resistors, and the gain of the "current mirror amplifier" comprised by compound transistor 18 will, for high signal current levels, be the resistance of resistor 185 divided by that of resistor 184. This high-level current gain is usually made much larger than the $h_{fe}$ of 181, but smaller than the product of the $h_{fe}$'s of transistors 181 and 182.

Resistor 186 is a pull-down resistor for the emitter electrode of 182. Elements 201, 202, 203, 204, 205, 206 of compound transistor 20' correspond respectively to elements 181, 182, 183, 184, 185, 186 of compound transistor 18'.

The controlled current source 17 supplying the joined emitter electrodes of transistors 11 and 12 comprises those elements with reference numerals starting with the two digits 1, 7. A direct potential $V_A$ developed by means not shown, is appreciably smaller than the $V_B$ operating potential applied to terminal 27, but larger than the $V_{BE}$ offset potential across the base-emitter junction of a transistor —e.g., about 1-2 volts. Transistor 171 is provided with an emitter degeneration resistor 172 and has $V_A$ applied to its base electrode. This conditions transistor 171 to demand a constant collector current $I_{C171}$ from the input port of a current mirror amplifier 173 comprising transistors 174, 175, 176. The output port of current mirror amplifier 173 supplies the joined emitter electrodes of transistors 11 and 12 with a component of current proportionally related to $I_{C171}$. This current component provides a lower limit to the base drive current available to transistor 181 during signal peaks no matter what the emitter-to-collector potential of 181 is. This limit is chosen so the collector current $I_U$, signal peaks may cause to flow in transistor 181, cannot over-dissipate 181 despite full operating potential $V_B$ appearing between its emitter and collector electrodes. Such condition might obtain were output terminal 21 accidentally shorted to terminal 27, for example.

The controlled current source 19 includes elements 191, 192, 193, 194, 195 and 196 which operate in the same manner as elements 171, 172, 173, 174, 175 and 176, respectively, of source 17 as thus far described. Just as a small collector current $I_U$ can be caused to flow to transistor 181, no matter what its collector current and emitter-to-collector potential conditions are, for similar reasons a small emitter current $I_U'$ can be caused to flow from transistor 201, no matter what its collector current and emitter-to-collector potential conditions are. This ensures that there will always be some current available from the amplifier to charge or discharge a coupling capacitor (not shown) used to connect output terminal 21 to a low-impedance load (not shown). In an amplifier provided with protection against over-dissipation of its output transistors—e.g., the FIGURE amplifier—redistribution of charge on the coupling capacitor can activate the protection circuitry. An amplifier without specific means for charging on or discharging the coupling capacitor exhibits a protracted period between applying operating potential and having full amplification capability available, which is undesirable.

Current mirror amplifier 173 in controlled current source 17 also receives $I_{C177}$, the collector current of transistor 177, as input current. $I_{C177}$ varies as a function of the emitter-to-collector potential, $V_{CE181}$, of 181, as is explained hereinafter. At low values of $V_{CE181}$, $I_{C177}$ is at its maximum. This permits the maximum rated collector current of transistor 181 to flow responsive to increased collector current demands of transistors 30 and 31. But, as $V_{CE181}$ increases beyond a particular threshold potential $V_T$, $I_{C177}$ is reduced proportional to ($V_{CE181} - V_T$), curtailing the base current drive available to 181 substantially proportionally to ($V_{CE181} - V_T$), and thereby reducing its maximum collector current commensurately. Finally, at a value of $V_U$ of $V_{CE181}$, $I_{C177}$ becomes zero-valued and the collector current of 181 can have a maximum value only of $I_U$, available in response to the continuing flow of $I_{C177}$.

Figure 2:
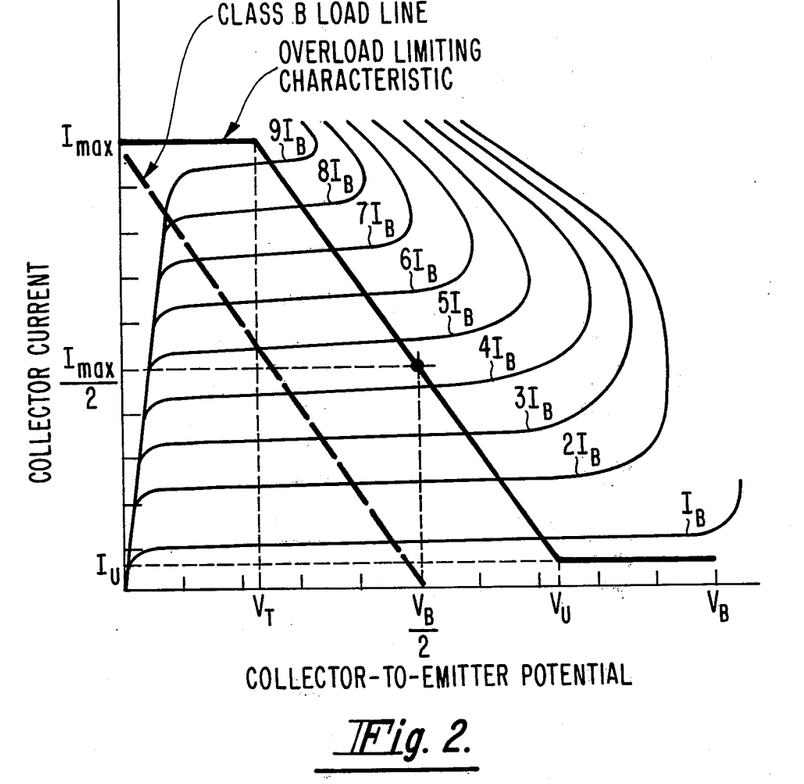
FIG. 2 is the collector characteristic of an amplifier output transistor having superimposed on it the load-line limiting characteristic provided by the present invention.

FIG. 2 shows this overload limiting characteristic plotted over the collector characteristics of transistor 181. The maximum current flows permitted by overload limiting characteristics are substantially higher than that to be expected from rated minimum resistive load for maximum rated output current $I_{MAX}$. This accommodates the driving of inductive loads such as loudspeakers. The sloping portion of the overload limiting characteristic is located so as to prevent the transistor from operating in the region where its collector current characteristics fold back--that is, so as to avoid second breakdown.

Referring back to FIG. 1, the control of $I_{C177}$ will now be considered. $I_{C177}$ is substantially equal to the emitter current flow in 177, which, in turn, is by Ohm's Law, equal to the potential drop $V_{178}$ across resistor 178 divided by the resistance of $R_{178}$. Potential regulator 40 comprises a series-regulator transistor 41 maintaining a seven volt potential between its emitter and collector electrodes responsive to collector-to-base feedback applied by a potential divider comprising avalanche diode 42 and resistor 43. The network comprising resistors 44 and 45 and a potential regulator 40 establishes a potential at the base electrode of 177 about 3.5 volts more positive than $V_B/2$, the quiescent value of $V_{21}$ at output terminal 21. The emitter-follower action of 177 places its emitter electrode at a quiescent potential about 2.8 volts more positive than $V_B/2$. So, $V_{178}$ equals 2.8 volts, and the resistance of resistor 178 can be chosen to obtain the desired value of $I_{C181}$ (e.g., one-half $I_{MAX}$) for the $V_{CE181} = V_B/2$ condition.

As $V_{21}$ swings to a more positive value, increasing $V_{CE181}$, $V_{178}$ is reduced, commensurately reducing $I_{E177}$ and thus $I_{C177}$ proportionately. When $V_{21}$ exceeds a $V_U$ equal to $V_B/2$ plus 2.8 volts, transistor 177 is cut-off and $I_{C177}$ equals zero.

When $V_{21}$ swings to a less positive value than $V_B/2$ the potential drop across 178 increases, increasing $I_{C177}$ proportionately. As $V_{21}$ becomes still less positive, reducing $V_{CE181}$ to a value $V_T$, the base-emitter junction of 46 is biased into conduction. As $V_{21}$ becomes still less positive, this reduction in potential is coupled by the emitter-follower action of transistor 46 and the offset potential across potential regulator 40 to the base electrode of 177. The emitter-follower action of 177 causes a reduction in potential at the emitter electrode of 177 corresponding to that in $V_{21}$ for this $V_{21} < V_T$ condition. This keeps $V_{178}$ substantially constant, causing substantially constant $I_{E177}$ flow through 178, causing $I_{C177}$ to be substantially constant despite $V_{21}$ becoming increasingly less positive.

Transistor 201 is provided similar overload protection to that afforded to transistor 181, by controlling the collector current $I_{C197}$ of transistor 197 in complementary fashion to $I_{C177}$. The network comprising resistors 44 and 45 and potential regulator 40 establishes a potential at the base electrode of 197 about 3.5 volts less positive than $V_B/2$, the quiescent value of $V_{21}$. The emitter-follower action of 197 places its emitter electrode at a quiescent potential about 2.8 volts less positive than $V_B/2$ so $V_{198}$, the potential drop across resistor 198, equals 2.8 volts, and the resistance $R_{198}$ of resistor 198 can be chosen to obtain a desired value of $I_{C197}$. $I_{C197}$ is applied to the input circuit of a current mirror amplifier 199 having minusunity current gain, and the output current from current mirror amplifier 199 is supplied to the input circuit of current mirror amplifier 193. Current mirror amplifier 193 supplies, therefore, a current to the joined emitter electrodes of transistors 13 and 14 which is proportional to $I_{C197}$.

As $V_{21}$ swings to a less positive value, increasing the emitter-to-collector potential $V_{CE201}$ of transistor 201, $V_{198}$ is reduced commensurately, reducing $I_{C197}$ proportionately. When $V_{CE201}$ exceeds $V_U$, 197 is cut-off and $I_{C197}$ equals zero. When $V_{21}$ swings to a more positive value than $V_B/2$ the potential drop across resistor 198 increases, increasing $I_{C197}$ proportionately. As $V_{21}$ becomes still more positive, reducing $V_{CE201}$ to a value $V_T$, the base-emitter junction of transistor 47 is biased into conduction. Thereupon, as $V_{21}$ becomes still more positive, the change in this potential is coupled by the potential follower actions of transistor 47, potential regulator 40 and transistor 197 to maintain $V_{198}$ substantially unchanged. This causes $I_{C197}$ to remain constant for this $V_{21} > V_B-V_T$ condition.

Provided with the foregoing description of the overload protection scheme involved in the present invention, the skilled circuit designer can design modifications to tailor the over-load limiting characteristic to particular designs of output transistors 181, 201. The volts/milliamperes slope of the falling portion of the characteristic is governed by the resistance of resistors 178 and 198. The current at the intercept of this slope with $V_B/2$ potential is controlled by selection of the quiescent base potentials of 177 and 197. With the connections of transistors 46 and 47 shown in FIG. 1, $I_{MAX}$ is substantially twice the current at that intercept but offsetting the emitter electrodes of 46 and 47 from the base electrodes of 197 and 177, respectively, can alter this relationship.

The over-load protection scheme used in the FIG. 1 circuit invites comparison with Leidich's. Leidich supplies temperature-compensated base currents to the output transistors of his amplifier, which transistors are free to exhibit temperature dependencies in their current gains. In the FIG. 1 circuit, the current gains of the output transistors 181 and 201 are stabilized to be independent of temperature by their connection in the "current mirror amplifiers" 18 and 20, as previously described; and the base current drives are not inversely related to the current gains of the output transistors nor need they be so related in order to obtain predictable over-load current. This is desirable since the open-loop gain of the amplifier can be kept in constant with temperature, simplifying the designing of the amplifier into feedback loops. Leidich provides the same degree of over-load current limiting for all emitter-to-collector potential conditions on the output transistors of his amplifier, sacrificing the ability to operate over a substantial portion of their safe operating area ratings (SOAR's).

The offset potential developed across the potential regulator comprising elements 32-34 forestalls the possibility of forward-biasing of the collector-to-base junction of transistor 11 when transistor 30 is driven into saturation.

Transistor 51 is provided with an emitter degeneration resistor 52 and has bias potential $V_A$ applied to its base electrode. This conditions 51 to withdraw a constant collector current from the input circuit of a current mirror amplifier 53 comprising elements 54, 55, 56 and 36. Amplifier 53 responds to supply a constant output current from the collector electrode of 36.

The configuration 60 including elements 61-70 develops the $\Delta V_{BE}$ potential applied between the base electrodes of 12 and 14, and in essence takes the form of a two-terminal current regulator circuit between $V_{21}$ and $V_B$. Elements 61-63 form a current amplifier 64 with an input terminal at the base electrode of 61, a common terminal at the joined emitter electrodes of transistors 61 and 62, and an output terminal at the collector electrode of transistor 62. At relatively low current levels, the current gain of amplifier 64 is the ratio of the transconductance of 62 to the transconductance of 61, the potential drop across resistor 63 being negligible so amplifier 64 functions like a conventional simple current mirror amplifier. At higher current levels, the potential drop across resistor 63 reduces the base-emitter potential of transistor 62 vis-a-vis that of transistor 61 and reduces the current gain of amplifier 64. Elements 65-68 form a current amplifier 69 with an input terminal at the connection of the collector electrode of 65 and the base electrode of 67; a common terminal at the emitter electrode of 66; and an output terminal at the collector electrode of 66. At relatively low current levels, the current gain of amplifier 69 is the ratio of the transconductance of 66 to the transconductance of 65, the potential drop across resistor 68 being negligible so amplifier 69 functions like a well-known current mirror amplifier. At higher current levels, the potential drop across resistor 68 increases, so the base-emitter potential of 66 vis-a-vis that of 65 increases, increasing the current gain of current amplifier 69. The output terminal of current amplifier 64 is connected to the input terminal of current amplifier 69; and the output terminal of amplifier 69 is connected via resistor 70 to the input terminal of amplifier 64, thus forming a positive feedback loop.

Assume the low-level current gains of current amplifiers 64 and 69 are each made to be minus unity by matching the transconductances of 61 and 62 to each other and by matching the transconductances of 65 and 66 to each other. Then, at relatively low current levels, the current flowing through the collector-emitter paths of 66 and 61 would be substantially the same in amplitude as the current flowing in the collector-emitter paths of 62 and 65. The base currents of 12 and 14 applied to the input circuit of current amplifier 64 give rise to such current flows. Responsive to these flows, the potential drop across resistor 68 will exceed that across resistor 63 because the resistance of the resistor 68 exceeds that of resistor 63. This will tend to increase the current gain of amplifier 69 by a greater factor than the current gain of amplifier 64 is reduced, so the regenerative feedback loop exhibits an open-loop gain greater than unity. In the closed loop, this results in a growth of the current levels in the loop. In this regenerative process, the current flow through the collector-to-emitter paths of 66 and 61 increases more rapidly than that through the collector-emitter paths of 62 and 65. Therefore, the potential drop across resistor 68 tends to more closely approach that across resistor 63 despite both of these potential drops tending to increase. This means the current gain of the amplifier 69, although increasing, will at some point in the regenerative process, begin to increase less rapidly than the gain of current amplifier 64 is decreased. When the potential drops across resistors 68 and 63 become equal, an equilibrium condition is reached where the current gains of amplifiers 64 and 69 are in reciprocal relationship to each other. This causes the positive feedback loop to have an open-loop gain of unity, and there is no further regenerative growth in the currents in the loop.

It can be shown, proceeding from a standard equation describing transistor operation, that when this equilibrium condition obtains, the potential drop across resistors 70 and 63 has the value $(kT/q)(R_{63}+R_{70})(1/R_{63})$ ln $(R_{68}/R_{63})$ in which $R_{63}$, $R_{68}$ and $R_{70}$ are the respective resistances of resistors 63, 68 and 70.

Figure 3:
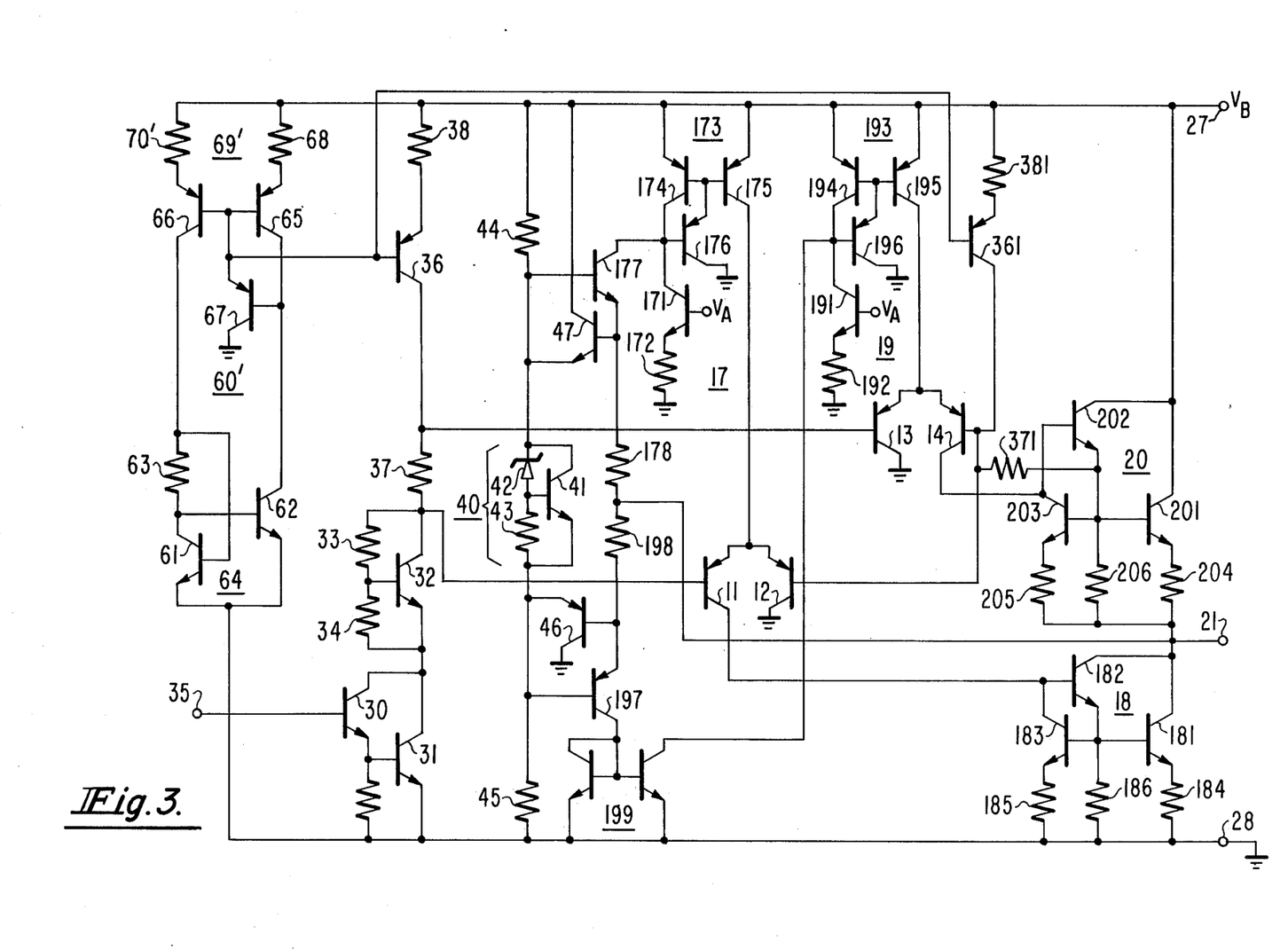

FIG. 3 shows a Class B push-pull amplifier similar to that of FIG. 1 insofar as how load-line limiting is carried out. However, the relative biasing of the base electrodes of transistors 11, 12, 13 and 14 is carried out differently. Transistors 12 and 14 have interconnected base electrodes and a $\Delta V_{BE}$ offset potential drop across resistor 37 biases the base electrode of transistor 11 more positive than that of transistor 13.

Configuration 60' resembles configuration 60, but is connected between the operating potential terminals 27 and 28, rather than between terminal 27 and a point closely following the output terminal 21 in potential. Also, current amplifier 69' includes a resistor 70'. Resistors 70' and 68 have resistances $R_{70}$ and $R_{68}$, respectively, related in a proportion reciprocally related to the effective base-emitter junction areas of transistors 66 and 65. Accordingly, current amplifier 69' is a current mirror amplifier with fixed current gain, $-G$, G being less than unity. Equilibrium obtains when the potential drops across resistor 63 equals $-(kT/q)$ ln G.

Transistor 36 and its emitter degeneration resistor 38 are proportioned vis-a-vis transistor 66 and its emitter degeneration resistor 70, respectively, so collector current flow from transistor 36 is proportional to the collector current flow of transistor 66, causing the potential drop across resistor 37 to be proportional to that across resistor 63. Transistor 361 and its emitter degeneration resistor 381 are proportioned vis-a-vis transistor 66 and its emitter degeneration resistor 70', respectively, so collector current flow from transistor 361 is proportional to the collector current flow of transistor 66, causing the potential drop across resistor 371 to be proportional to that across resistor 63. The FIG. 3 configuration is advantageous over that of FIG. 1 in eliminating need for elements 51-56.

Amplifiers are possible, similar to those in FIGS. 1 and 3, but in which the serial connection of compound transistor structures 18 and 20 is reversed, the application of overall feedback is appropriately modified to maintain it degenerative, $I_{19}$ is applied to the joined emitter electrodes of transistors 11 and 12, $I_{17}$ is applied to the joined emitter electrodes of transistors 13 and 14, and $\Delta V_{BE}$ biasing is applied between the base electrodes of transistors 12 and 14. Such amplifiers embody the present invention.

A number of other embodiments of the present invention will occur to the skilled electronic design engineer and this should be considered in construing the scope of the following claims.

What is claimed is:

1. Push-pull amplifier circuitry comprising:

first and second transistor means, each having a control electrode for receiving a respective drive signal current and each having an output circuit for responding to its respective drive signal current with a respective output signal related to its respective drive current signal in a predetermined relationship;

means connected to the output circuits of said first and said second transistor means for combining their respective input signals in push-pull;

first controlled current source means, for supplying a first bias current having a substantially linear response to the potential appearing across the output circuit of said first transistor means, said response such that said first bias current increases or decreases as the potential appearing across the output circuit of said first transistor means respectively decreases or increases between a first prescribed amplitude and a second prescribed amplitude;

means for applying a portion of said first bias current linearly responsive to excursions of a first polarity in an input signal to the control electrode of said first transistor means as its drive signal current;

second controlled current source means, for supplying a second bias current having a substantially linear response to the potential appearing across the output circuit of said second transistor means, said response such that said second bias current increases or decreases as the potential appearing across the output circuit of said second transistor means respectively decreases or increases between a third prescribed amplitude and a fourth prescribed amplitude; and means for applying a portion of said second bias current linearly responsive to excursions of a second polarity in said input signal to the control electrode of said second transistor means as its drive signal current, said second polarity being opposite to said first polarity, said prescribed amp litudes and said substantially linear relationships being chosen for operating said first and said second transistor means within their safe operating area ratings.

2. Push-pull amplifier circuitry as set forth in claim 1 wherein said first controlled current source means comprises:

a first current amplifying means having an input terminal, having a common terminal, having an output terminal through which said first bias current flows; and a first resistance having a first end connected to the input terminal of said first current amplifying means and having a second end, which second end and the common terminal of said first current amplifying means are respectively connected to opposite ends of the output circuit of said second transistor means for engendering an input current to said first current amplifier responsive to the potential across the output circuit of said second transistor means, and wherein said second controlled current source means comprises:

a second current amplifying means having an input terminal, having a common terminal, and having an output terminal through which said second bias current flows;

a second resistance having a first end connected to the input terminal of said second current amplifying means and having a second end, which second end and the common terminal of said second current amplifying means are respectively connected to opposite ends of the output circuit of said first transistor means for engendering an input current to said second current amplifier responsive to the potential across the output circuit of said first transistor means, and wherein there is:

means serially connecting the output circuits of said first and said second transistor means for receiving an operating potential.

3. Amplifier circuitry as set forth in claim 1 wherein said first and said second transistor means are similar transistor means of the same conductivity type having their output circuits serially connected to receive an operating potential, wherein said first and said third prescribed amplitudes are substantially equal to each other, and wherein said second and said fourth prescribed amplitudes are substantially equal to each other, and wherein the substantially linear relationships of said first and said second bias currents respectively to the potential appearing across the output circuit of said first transistor means and to the potential appearing across the output circuit of said second transistor means are similar to each other.

4. Push-pull amplifier circuitry as set forth in claim 3 wherein said means for applying a portion of said first bias current linearly responsive to excursions of a first polarity in said input signal includes:

first and second transistors of a first conductivity type, each having base and emitter and collector electrodes, said input signal being applied between their respective base electrodes, their emitter electrodes being connected together at a first node to receive said first bias current, the collector electrode of said first transistor being connected to the control electrode of said first transistor means, and the second transistor being connected as a common-collector transistor;

and wherein said means for applying a portion of said second bias current linearly responsive to excursions of a second polarity in said input signal includes:

third and fourth transistors of said first conductivity type, each having base and emitter and collector electrodes, said input signal being applied between their respective base electrodes, their emitter electrodes being connected together at a second node to receive said second bias current, the third transistor being connected as a common-collector transistor, and the collector electrode of said fourth transistor being direct coupled to the control electrode of said second transistor means.

5. Push-pull amplifier circuitry as set forth in claim 4 having:

means for applying said input signal to an interconnection of the base electrodes of said first and said third transistors; and means for supplying a pair of potentials, one relatively positive and the other relatively negative with respect to the quiescent level of said input signal, said pair of potentials having a difference between them which is linearly related to the absolute temperature close to which said first and second and third and said fourth transistors are operated, appropriate ones of said pair of potentials being applied respectively to the base electrode of said second transistor for causing its quiescent conduction to be relatively large compared to that of said first transistor and to the base electrode of said fourth transistor for causing its quiescent conduction to be relatively small compared to that of said third tranistor.

6. Push-pull amplifier circuitry as set forth in claim 4 wherein said first and second controlled current source means together comprise:

fifth and sixth transistors respectively of said first conductivity type and of a second conductivity type complementary to said first conductivity type, said fifth and said sixth transistors each having base and emitter and collector electrodes;

first and second resistances having respective first ends respectively connected to the emitter electrode of said fifth transistor and to the emitter electrode of said sixth transistor and having respective second ends joined at an interconnection to which the output signals of said first and said second transistor means combined in push-pull are applied;

third and fourth resistances having respective first ends connected respectively to the base electrode of said fifth transistor and to the base electrode of said sixth transistor and having respective second ends between which a potential is applied of a polarity tending to forward-bias the base-emitter junctions of said fifth and said sixth transistors;

means connected between the base electrodes of said fifth and said sixth transistors for maintaining a substantially constant potential therebetween, which substantially constant potential is smaller than the potential applied between the second ends of said third and said fourth resistances;

a seventh transistor of said first conductivity type being connected in common-emitter amplifier configuration, having a base electrode to which the collector electrode of said sixth transistor is direct coupled, and having a collector electrode galvanically coupled to said first node;

a current inverting amplifier having an input terminal to which the collector electrode of said fifth transistor is direct coupled and having an output terminal; and an eighth transistor of said first conductivity type being connected in common-emitter amplifier configuration, having a base electrode to which the output terminal of said current inverting amplifier is direct coupled, and having a collector electrode galvanically coupled to said second node.

7. Push-pull amplifier circuitry as set forth in claim 6 wherein said first and second controlled current source means together further comprise:

ninth and tenth transistors being respectively of said first conductivity type and of said second conductivity type, being connected in common-collector configuration, having respective base electrodes respectively connected to the emitter electrode of said fifth transistor and to the emitter electrode of said sixth transistor, and having respective emitter electrodes respectively connected to the base electrode of said fifth transistor and to the base electrode of said sixth transistor.

8. Push-pull amplifier circuitry as set forth in claim 7 including means for applying a constant augmentation to the collector current of said sixth transistor.

9. Push-pull amplifier circuitry as set forth in claim 6 wherein said first and second controlled current source means together further include means for stabilizing the common-emitter amplifier gain of said seventh transistor and means for stabilizing the current gain of said eighth transistor.

10. Push-pull amplifier circuitry as set forth in claim 4 wherein said first controlled current source means comprises:

a first current amplifying means having an input terminal, having a common terminal, and having an output terminal connected to said first node; and a first resistance having a first end connected to the input terminal of said first current amplifying means and having a second end, which second end and the common terminal of said first current amplifying means are respectively connected to opposite ends of the output circuit of said second transistor means, and wherein said second controlled current source means comprises:

a second current amplifying means having an input terminal, having a common terminal, and having an output terminal connected to said second node;

a second resistance having a first end connected to the input terminal of said second current amplifying means and having a second end, which second end and the common terminal of said second current amplifying means are respectively connected to opposite ends of the output circuit of said first transistor means, and wherein there is:

means serially connecting the output circuits of said first and said second transistor means for receiving an operating potential.

11. Push-pull amplifier circuitry as set forth in claim 1 wherein either of said transistor means individually considered comprises:

first and second transistors of the same conductivity type, each having base and emitter and collector electrodes, the control electrode of said individually considered transistor means being similarly direct coupled to each of the respective base electrodes of its said first and said second transistors and having the collector electrode of its said second transistor galvanically connected thereto;

first galvanic connection means between a first end of the output circuit of said individually considered transistor means and the collector electrode of its said first transistor;

second galvanic connection means between a second end opposite to the first end of the output circuit of said individually considered transistor means and the emitter electrode of its said first transistor; and third galvanic connection means between said second end of the output circuit of said individually considered transistor means and the emitter electrode of its said second transistor.

12. Push-pull amplifier circuitry as set forth in claim 11 wherein said individually considered transistor means has first and second resistances of relatively low and relatively high value corresponding respectively to its respective second and third galvanic connection means.

13. Push-pull amplifier circuitry as set forth in claim 1 wherein said means for applying a portion of said first bias current linearly responsive to excursions of a first polarity in an input signal includes:
  first and second transistors of similar conductivity type, each having base and emitter and collector electrodes, said input signal being applied between their respective base electrodes, their emitter electrodes being connected together to receive said first bias current, the collector electrode of said first transistor being direct coupled to the control electrode of said first transistor means, and the second transistor being connected as a common-collector transistor;
  and wherein said means for applying a portion of said second bias current linearly responsive to excursions of a second polarity in an input signal includes:
  third and fourth transistors of similar conductivity type, each having base emitter and collector electrodes, said input signal being applied between their respective base electrodes, their emitter electrodes being connected together to receive said second bias current, the third transistor being connected as a common-collector transistor, and the collector electrode of said fourth transistor being direct coupled to the control electrode of said second transistor means.

14. Amplifier circuitry comprising:
  first and second terminals for receiving a fixed operating potential therebetween;
  a transistor having base and emitter and collector electrodes, having a base-emitter junction between its base and emitter electrodes and having a variable-conduction path between its collector and emitter electrodes the conduction of which is regulated responsive to current through its base electrode;
  load means serially connected with the variable conduction path of said transistor between said first and said second terminals;
  controlled current source means for supplying a current proportionally responsive to the potential across said load means, said current increasing and decreasing as the potential across said load means respectively increases and decreases, the proportionality between said proportionally responsive current and the potential across said load means so chosen as to avoid operation of said transistor outside its Safe Operating Area Rating; and
  means for applying, so long as available from said controlled current source means, a portion of said current linearly related to the potential across said load means, which portion is applied to the base electrode of said transistor and is linearly responsive to swings of an input signal in one polarity.

15. Push-pull amplifier circuitry comprising:
  first and second terminals for receiving an operating potential therebetween;
  a third terminal for receiving an input signal;
  a fourth terminal for output signal responsive to said input signal;
  first and second and third and fourth transistors of a first conductivity type and fifth and sixth transistors of a second conductivity type, each transistor having base and emitter and collector electrodes;
  first and second direct current conductive means connecting the collector electrodes of said second and said third transistors to said first terminal;
  a first circuit node to which said third terminal is direct coupled;
  means for direct coupling said first circuit node to the base electrode of said first transistor;
  means for direct coupling said first circuit node to the base electrode of said third transistor;
  a second circuit node to which said fourth terminal is direct coupled;
  means for direct coupling said second circuit node to the base electrode of said second transistor;
  means for direct coupling said second circuit node to the base electrode of said fourth transistor;
  means for direct coupling the collector electrode of said first transistor to the base electrode of said fifth transistor;
  means for direct coupling the collector electrode of said fourth transistor to the base electrode of said sixth transistor;
  third and fourth direct current conductive means connecting the respective emitter electrodes of said fifth and said sixth transistors to said first terminal and to said fourth terminal, respectively;
  fifth and sixth direct current conductive means connecting the respective collector electrodes of said fifth and said sixth transistors to said fourth terminal and to said second terminal, respectively;
  a third circuit node to which the emitter electrodes of said first and said second transistors are connected;
  a fourth circuit node to which the emitter electrodes of said third and said fourth transistors are connected;
  first current source means connected between said second terminal and said third circuit node for establishing the combined emitter current flows of said first and said second transistors; and
  second current source means connected between said second terminal and said fourth circuit node for establishing the combined emitter current flows of said third and said fourth transistors.

16. Push-pull amplifier circuitry as set forth in claim 15 wherein said first current source means consists of a first constant current source supplying a current the magnitude of which is independent of the potential between said second terminal and said third circuit node and wherein said second current source means consists of a second constant current source supplying a current the magnitude of which is independent of the potential between said second terminal and said fourth circuit node.

17. Push-pull amplifier circuitry as set forth in claim 16 wherein said first constant current source comprises:
  a seventh transistor of said first conductivity type having an emitter electrode direct current conductively connected to said second terminal, having a collector electrode direct current conductively connected to said third circuit node, and having a base electrode; and
  means responsive to the potential between said first and fourth terminals decreasing from a predetermined value at least half as large as said operating potential to apply increasing forward bias potential to the base electrode of said seventh transistor; and
  wherein said second constant current source comprises:
  an eighth transistor of said first conductivity type having an emitter electrode direct current conductively connected to said second terminal, having a collector electrode direct current conductively connected to said fourth circuit node, and having a base electrode; and means responsive to the potential between said second and said fourth terminals decreasing from said predetermined value to apply increasing forward bias potential to the base electrode of said eighth transistor.

18. Push-pull amplifier circuitry as set forth in claim 15 wherein means are provided for operating said first, said second, said third, and said fourth transistors at substantially the same absolute temperature T; wherein said means for direct coupling said first circuit node to the base electrode of said first transistor and said means for direct coupling said first circuit node to the base electrode of said third transistor consists respectively of direct connections without substantial intervening impedance of the base electrodes of said first and said third transistors to said first circuit node and wherein said means for direct coupling said second circuit node to the base electrode of said second transistor and said means for direct coupling said second node to the base electrode of said fourth transistor together comprise means for applying an offset potential between the base electrodes of said second and said fourth transistors which is proportional to T and is of a poling tending to reduce the quiescent conduction of said first and said fourth transistors relative to that of said second and said third transistors.

19. Push-pull amplifier circuitry as set forth in claim 15 wherein means are provided for operating said first, said second, said third, and said fourth transistors at substantially the same absolute temperature T; wherein said means for direct coupling said second circuit node to the base electrode of said second transistor and said means for direct coupling said second circuit node to the base electrode of said fourth transistor consists respectively of direct connections without substantial intervening impedance of the base electrodes of said second and said fourth transistors to said second circuit node and wherein said means for direct coupling said first circuit node to the base electrode of said first transistor and said means for direct coupling said first node to the base electrode of said third transistor together comprise means for applying an offset potential between the base electrodes of said first and said third transistors which is proportional to T and is of a poling tending to reduce the quiescent conduction of said first and said fourth transistors relative to that of said second and said third transistors.

20. Push-pull amplifier circuitry as set forth in claim 15 wherein each of said fifth and sixth transistors is a compound transistor which includes:
first, second and third component transistors of said second conductivity type, each having respective base and emitter and collector electrodes, the collector electrodes of said first and said second component transistors being connected at the collector electrode of the compound transistor, the base electrode of said second component transistor and the collector electrode of said third component transistor being connected at the base electrode of the compond transistor, the emitter electrode of said second component transistor being connected to the base electrodes of said first and said third component transistors;
a relatively low resistance and a relative high resistance having their respective first ends connected to the emitter electrode of said first component transistor and to the emitter electrode of said third component transistor, respectively, and having their respective second ends connected at the emitter electrode of the compound transistor.

21. In a transistor amplifier having output transistor means with a control electrode and with an output circuit arranged for completing a circuit including a power supply and load; having over-current protection circuitry of the type comprising a constant current generator for supplying a bias current sufficiently constrained in magnitude that, if applied in full to the control electrode of said output transistor means, said output transistor means would be provided protection against over-dissipation; and having means responsive to input signal for applying a changing portion of the current from said constant current generator to the control electrode of said output transistor means, an improvement wherein said constant current generator provides substantially temperature-independent bias current and wherein the adverse effects of applying portions of a temperature-independent bias current to the output transistor means are forestalled by said output transistor means comprising:
first and second transistors of the same conductivity type, each having base and emitter and collector electrodes, the control electrode of said transistor means being similarly direct coupled to each of the respective base electrodes of said first and said second transistors and having the collector electrode of said second transistor galvanically connected thereto; and
the collector electrode of said first transistor being galvanically connected to a first end of the output circuit of said output transistor means; and
first and second resistances of relatively low and relatively high value, having respective first ends respectively connected to the emitter electrode of said first transistor and to the emitter electrode of said second transistor, and having respective second ends connected together and to a second end of the output circuit of said output transistor means remote from its first end.

* * * * *

UNITED STATES PATENT OFFICE
CERTIFICATE OF CORRECTION

PATENT NO. : 4,058,775
DATED : November 15, 1977
INVENTOR(S) : Brian Crowle

It is certified that error appears in the above-identified patent and that said Letters Patent are hereby corrected as shown below:

```
Col.  6,  line 18,   "minusunity" should be --minus unity--.
Col.  9,  line 18,   "input" should be -- output --;
   "      line 47,   "amp litudes" should be -- amplitudes --.
Col. 16,  line  5,   "compond" should be -- compound --.
```

Signed and Sealed this

Twentieth Day of June 1978

[SEAL]

Attest:

RUTH C. MASON
*Attesting Officer*

DONALD W. BANNER
*Commissioner of Patents and Trademarks*